(12) United States Patent
Tu et al.

(10) Patent No.: US 7,652,887 B2
(45) Date of Patent: Jan. 26, 2010

(54) COUPLING ARRANGEMENT FOR ELECTRONIC DEVICE TO A VEHICLE BODY

(75) Inventors: Yijun Tu, Tecumseh (CA); Katherine Oster, Farmington Hills, MI (US); Beverly Katz, Livonia, MI (US); Mahmoud A. Anani, Dearborn Heights, MI (US); Christina M. Marcath, Romeo, MI (US)

(73) Assignee: Chrysler Group LLC, Auburn Hills, CT (US)

( * ) Notice: Subject to any disclaimer, the term of this patent is extended or adjusted under 35 U.S.C. 154(b) by 273 days.

(21) Appl. No.: 11/763,778

(22) Filed: Jun. 15, 2007

(65) Prior Publication Data

US 2008/0310124 A1 Dec. 18, 2008

(51) Int. Cl.
*H05K 7/00* (2006.01)
(52) U.S. Cl. .............................. 361/728; 361/825
(58) Field of Classification Search .................. 361/728, 361/784, 729, 825; 174/254, 260; 257/690–692
See application file for complete search history.

(56) References Cited

U.S. PATENT DOCUMENTS

| 4,053,130 | A | | 10/1977 | Birkner |
| 5,089,938 | A | * | 2/1992 | White et al. ................. 361/825 |
| 5,920,463 | A | * | 7/1999 | Thomas et al. .............. 361/760 |
| 5,943,207 | A | * | 8/1999 | Kim ............................ 361/673 |
| 6,666,414 | B2 | * | 12/2003 | Dean et al. .................. 248/27.3 |
| 7,403,373 | B2 | * | 7/2008 | McCoy et al. ............... 361/673 |

* cited by examiner

*Primary Examiner*—Dean A. Reichard
*Assistant Examiner*—Yuriy Semenenko
(74) *Attorney, Agent, or Firm*—Ralph E. Smith

(57) ABSTRACT

An electronic control module mounted to an adaptive vehicle mount or directly onto a car body. The control module includes a casing which may have at least one leverage tab integral with the casing. The casing also includes an integral fastening tab, and may act as a lever such that the leverage tab and fastener tab withstand forces which counterbalances the force exerted on the casing when the casing is mounted to an adaptive vehicle mount or directly onto the car body.

20 Claims, 4 Drawing Sheets

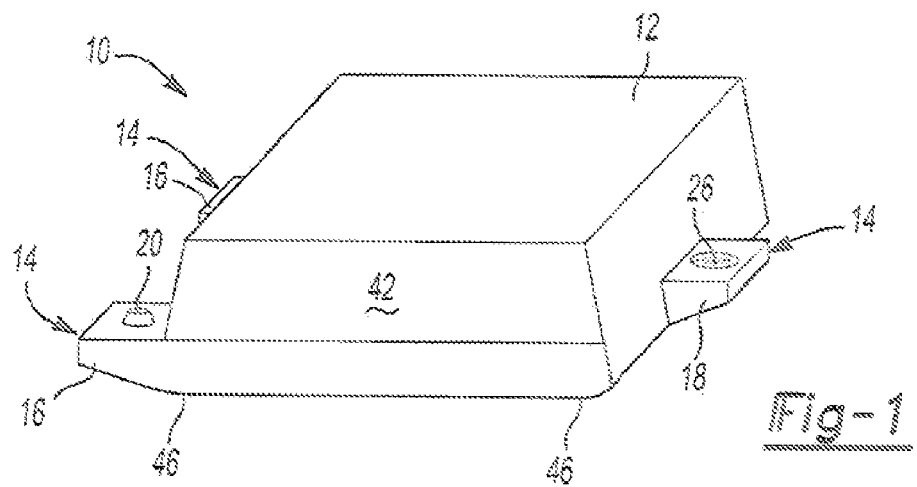
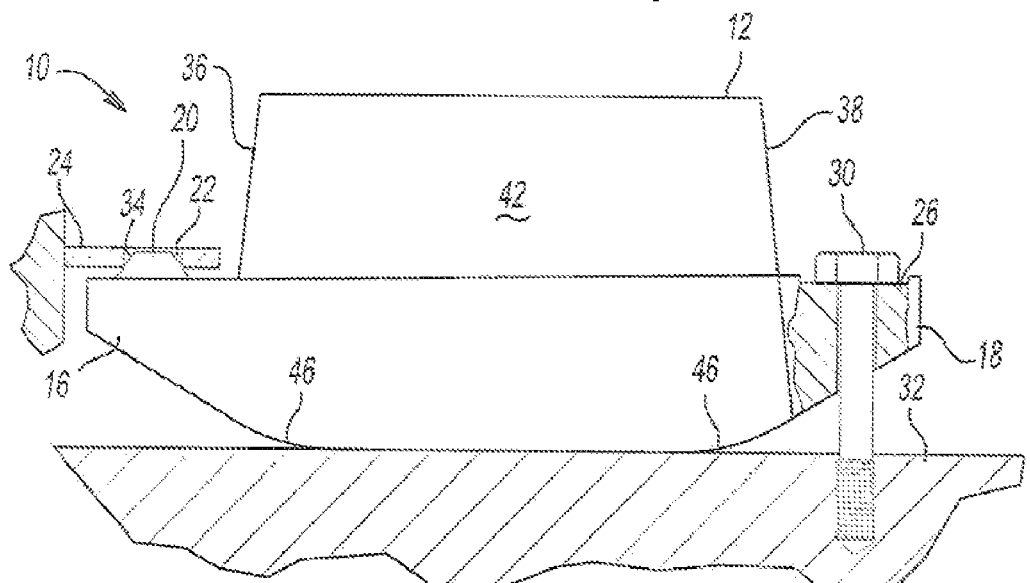
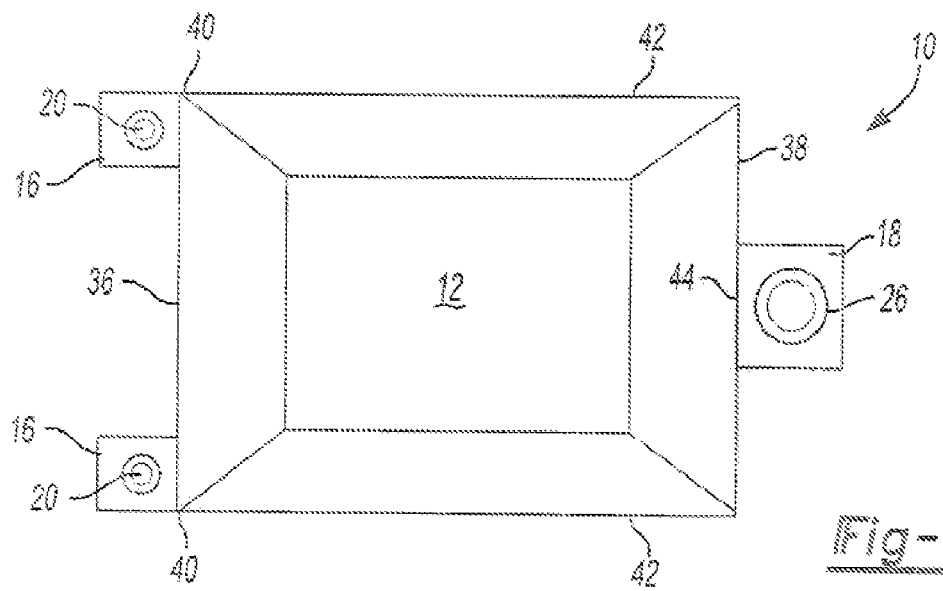

COUPLING ARRANGEMENT FOR ELECTRONIC DEVICE TO A VEHICLE BODY

FIELD

The present invention relates to an electronic control module.

BACKGROUND

Motor vehicles may include more than two dozen electronic control modules to control and manage various electronic features of the vehicle. Generally, electronic control modules are attached to the vehicle with a plurality of screws or bolts. Installing the control modules, therefore, is time consuming because of time needed to attach the screws or bolts to the control module and vehicle. As the number of control modules grows in a vehicle, the time needed to install the control modules in a vehicle will also increase. Furthermore, the fasteners required to mount the control modules affects the raw material costs and weight of the vehicle. The fewer the fasteners, the lower the costs and vehicle weight.

SUMMARY

An electronic control module is mounted to an adaptive vehicle mount or directly onto a car body. The control module includes a casing which may have at least one leverage tab integral with the casing. The casing may also include an integral fastening tab, and may act as a lever such that the leverage tab and fastener tab withstand forces which counterbalances the force exerted on the casing. The module may also include locking pins that may eliminate any movement of the electronic control module relative to the adaptive vehicle mount or car body.

Further areas of applicability, of the present disclosure will become apparent from the detailed description provided hereinafter. For example, the module may be used for sensors, actuators, or other electronic and non-electronic devices. It should be understood, however, that the detailed description and specific examples are intended for purposes of illustration only and are not intended to limit the scope of the present teachings.

DRAWINGS

The present disclosure will become more fully understood from the detailed description and the accompanying drawings, wherein:

FIG. 1 is a perspective view of a control module according to the present teachings;

FIG. 2 is a side-perspective view of a control module according to the present teachings coupled to a mount;

FIG. 3 is a top-perspective view of a control module according to the present teachings;

DETAILED DESCRIPTION

The following description is merely exemplary in nature and is in no way intended to limit the present teachings, their application, or uses.

Figure 7:
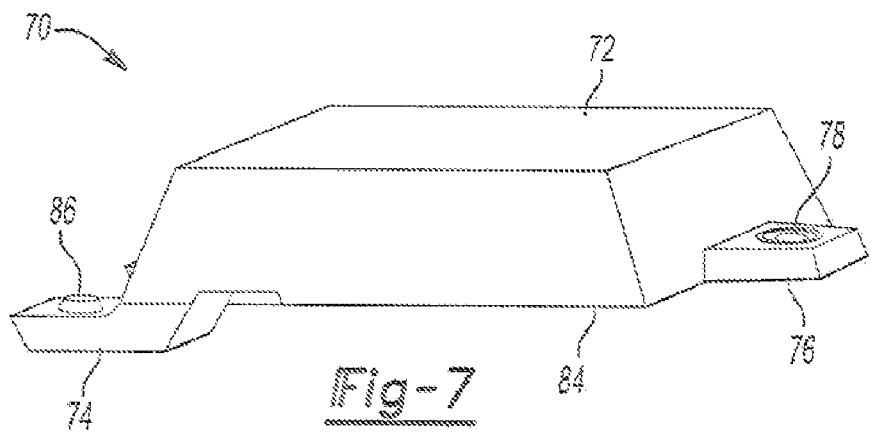
FIG. 7 is a perspective view of a control module according to the present teachings.
Figure 8:
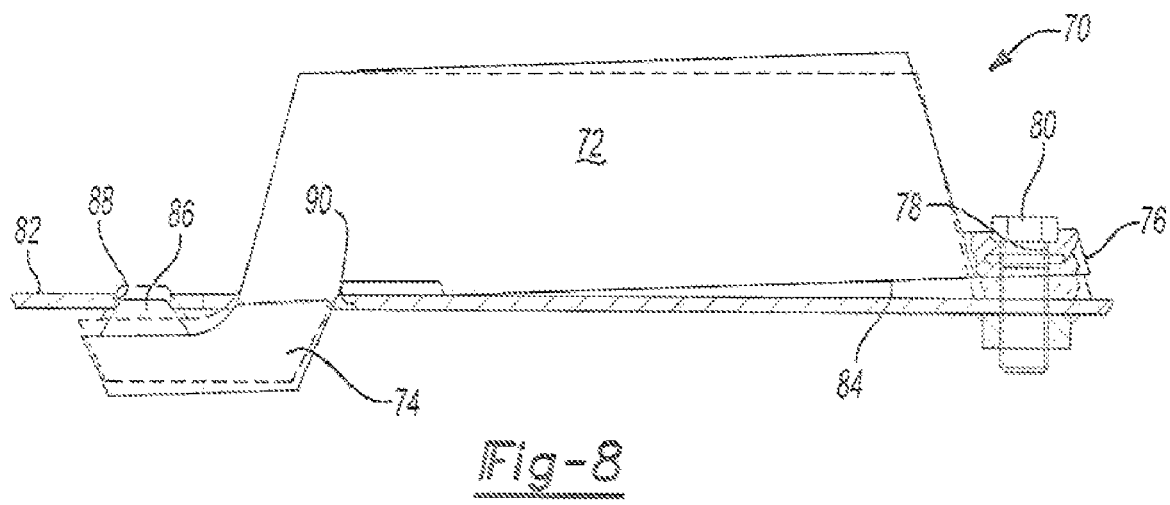
FIG. 8 is a side-perspective view of a control module according to the present teachings secured to a mount.
Figure 9:
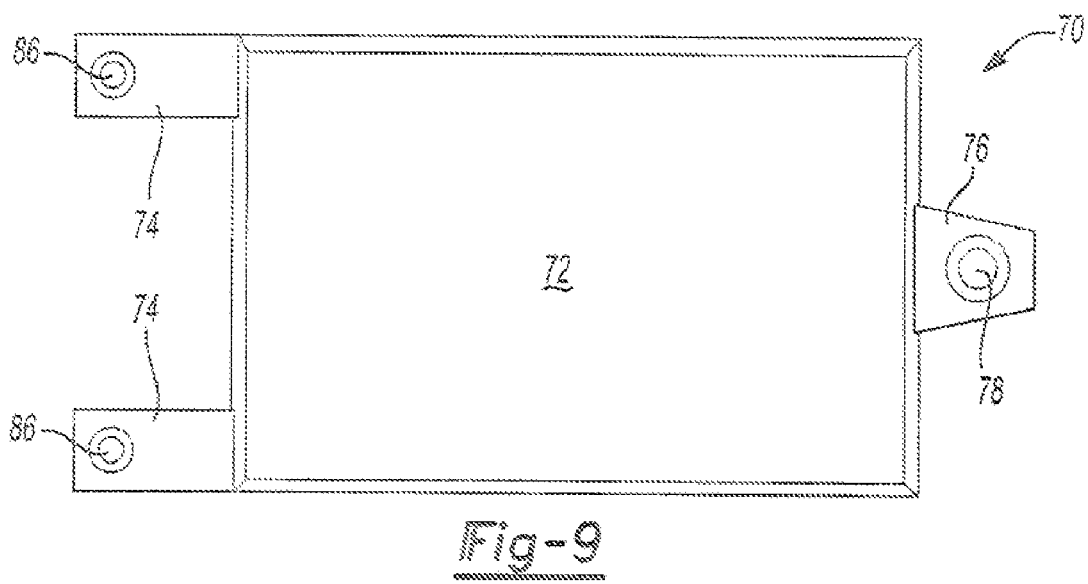
FIG. 9 is a top-perspective view of a control module according to the present teachings.
Figure 10:
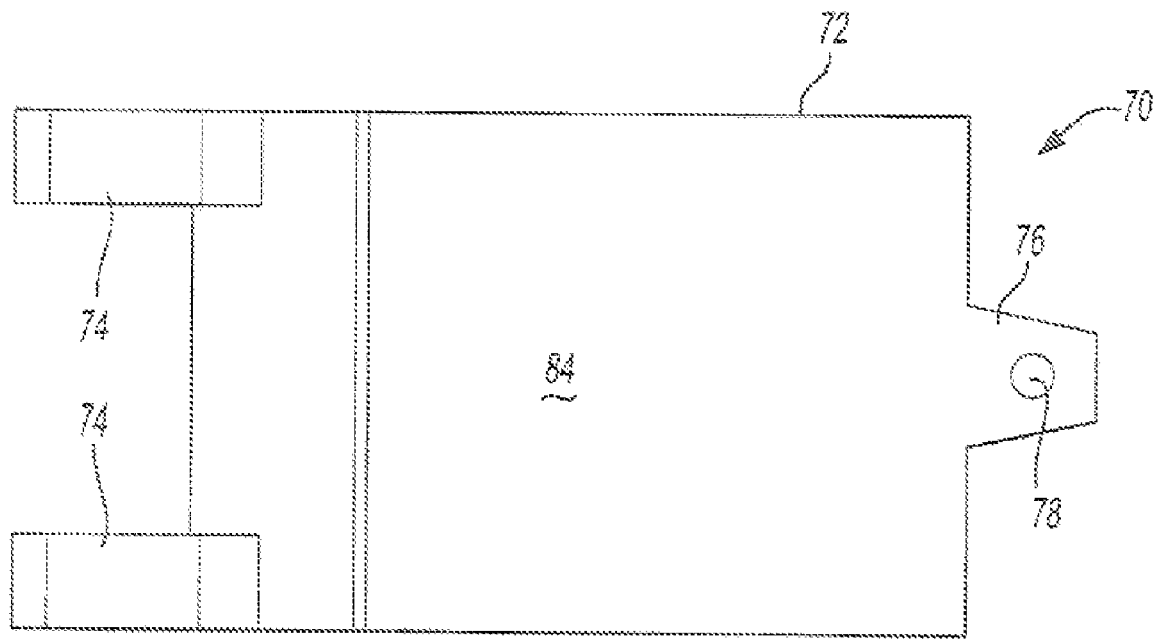
FIG. 10 is a bottom-perspective view of a control module according to the present teachings.
Figure 11:
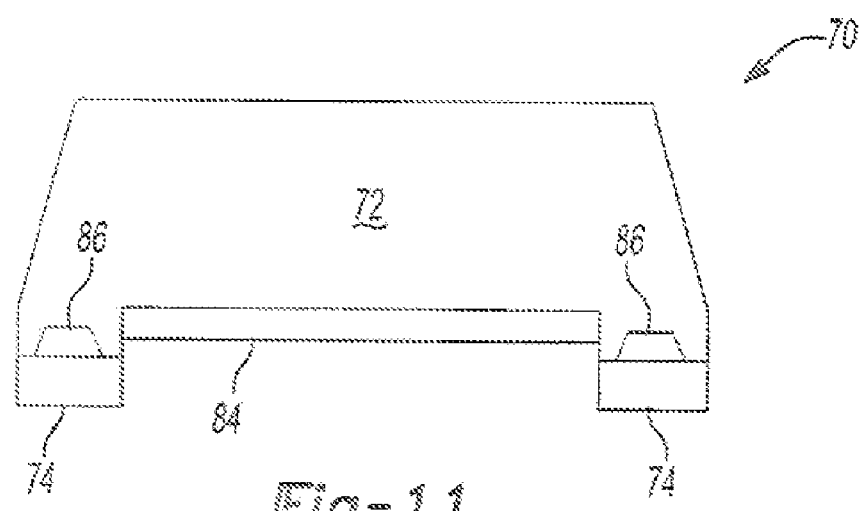
FIG. 11 is a side-perspective view of a control module according to the present teachings.

FIGS. 1 to 3 illustrate an electronic control module 10. Electronic control module 10 may be used to manage a variety of functional features present in motor vehicles such as sensors, actuators, airbags, and other electronic devices. Electronic control module 10 may generally include a casing 12 that houses various electronic components and a plurality of tabs 14 for coupling control module 10 to the motor vehicle. In FIGS. 1 and 2, casing 12 may be a two-piece casing that houses electronic components (not shown) therein. Casing 12, however, may be a monolithic casing like those illustrated in FIGS. 4 and 7.

Tabs 14 may include at least one leverage tab 16 and at least one fastening tab 18. Leverage tabs 16 may include a pin 20 that couples to an aperture 22 formed in an adaptive vehicle mount 24. Fastening tab 18 may include an aperture and countersink 26 for accommodating a fastener 30 that fastens to a mounting surface 32 of the motor vehicle. Fastener 30 may be any type of fastener such as a screw or bolt.

Pin 20 of leverage tab 16 may include a tapered surface 34. As illustrated in FIGS. 1 and 3, pin 20 is generally cylindrical and tapered surface 34 provides a generally conical-shape to pin 20. Other shapes, however, are within the scope of the present teachings. For example, pin 20 may be cubical or formed as a parallelpiped. Cubic or parallelpiped pins may also have a tapered surface 34 such that pin 20 forms a pyramid-like shape.

Tapered surface 34 ensures contact between pin 20 and aperture 22 such that movement of control module 10 relative to mounting surface may be eliminated. As stated above, however, pins may be formed without tapered surface 34. Regardless, it should be understood that pin 20 may include any shape or orientation so long as pin 20 engages aperture 22. For example, pin 20 without tapered surface 34 may function the same way as the design shown in FIGS. 1-8 when engaging with a tapered mounting aperture.

As shown in FIG. 3, leverage tabs 16 may be formed at a first end 36 of casing 12, while fastening tab 18 may be formed at a second end 38 of casing 12. Leverage tabs 16 may be formed at corners 40 of casing 12, which minimizes movement of casing 12 when pins 20 of leverage tabs 16 are engaged with apertures 22. Although leverage tabs 16 are shown formed at first end 36 of casing 12, it should be understood that leverage tabs 16 may be formed on sides 42 or any other applicable locations on casing 12 without departing from the spirit and scope of the present teachings.

Fastening tab 18 may be formed in a middle portion 44 of second end 38. Forming fastening tab 18 at middle portion 44 enables use of a single fastening tab 18 to secure casing 12 to mounting surface 32. Fastening tab 18, however, may be formed along any portion of casing 12 without limitation.

Casing 12 may include at least one curved lower surface 46. Providing casing 12 with curved surface 46 enables casing 12 to act as a lever when securing control module 10 to adaptive vehicle mount 24 and mounting surface 32. To install control module 10, an installer manipulates casing 12 such that pins 20 of leverage tabs 16 are aligned beneath apertures 22 formed in adaptive vehicle mount 24. Because of curved surface 46, casing 12 may be rotated to raise pins 20 to a position that engages apertures 22. After pins 20 engage apertures 22, the installer may use fastener 30 to secure fastening tab 18 to mounting surface 32. To assist in installation, leverage tabs 16 and fastening tab 18 may have a wedge-shape that enables the installer to more easily manipulate the casing 12 and leverage tabs 16 beneath adaptive vehicle mount 24.

Because casing 12 may act as a lever, securing fastening tab 18 to mounting surface 32 with fastener 30 forces and maintains contact between leverage tabs 16 and adaptive vehicle mount 24. Forces of mounting surface 34 and fastener 30 exerted leverage tabs 16 and fastening tab 18, respectively, counterbalance the force of mounting surface 32 exeredg on surface 46 to reliably secure control module 10 to the motor vehicle. That is, because casing 12 acts as a lever, a first force is exerted on fastener tab 18 downward through secured fastening 30 and a second force is exerted on leverage tabs 16 in the same direction through aperture 22, these two forces counterbalance the force mounting surface 32 exerted on casing bottom surface 46. Because of these counterbalancing forces, only a single fastening joint is needed to ensure that control module 10 remains secured to the motor vehicle. Because only a single fastening joint is required, the time required to install control module 10 may be reduced. Reducing installment time increases productivity. Moreover, a reduced quantity of fasteners results in lower material costs and vehicle weight.

Although casing 12 is shown to have a pair of curved surfaces 46 in FIG. 2, the present teaching should not be limited thereto. Only a single curved surface 46 is required to enable casing 12 to act as a lever that reliably secures control module 10 to adaptive vehicle mount 24 and mounting surface 32. Because only a pivot point between casing 12 and mount surface 32 is required to produce force that counterbalance forces on tabs 16 and 18, control module 10 is not required to mount between flat surfaces. That is, the casing leverage mechanism allows for a firmer connection between mounting surfaces such that a completely flat surface is not required like conventional control modules.

Figure 4:
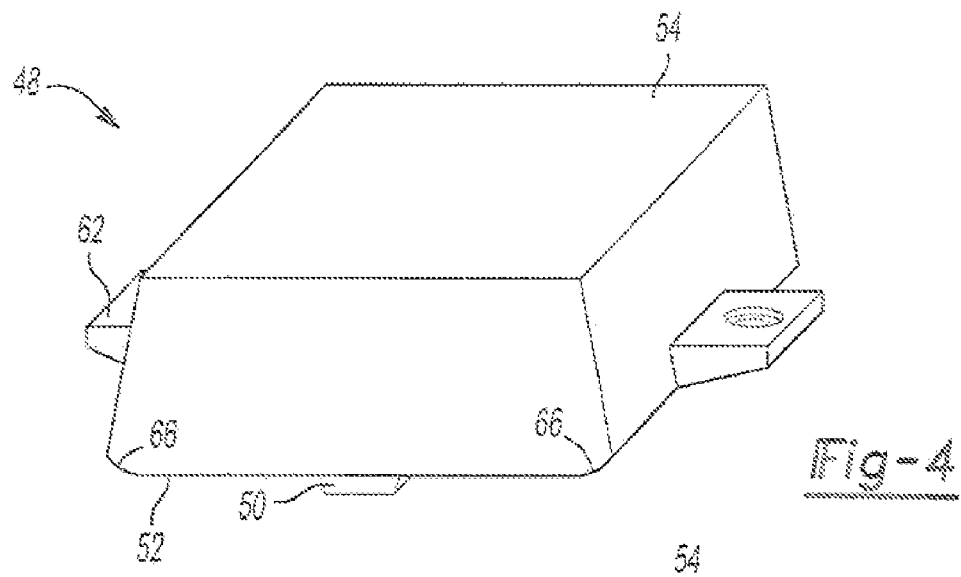
FIG. 4 is a perspective view of a control module according to the present teachings.
Figure 5:
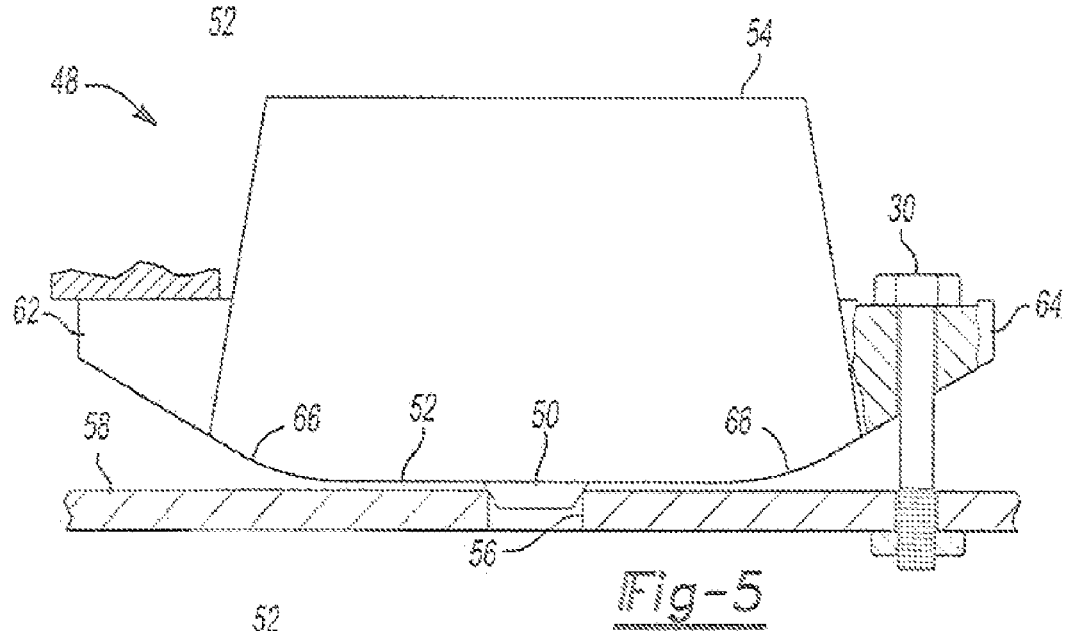
FIG. 5 is a side-perspective view of a control module according to the present teachings coupled to a mount.
Figure 6:
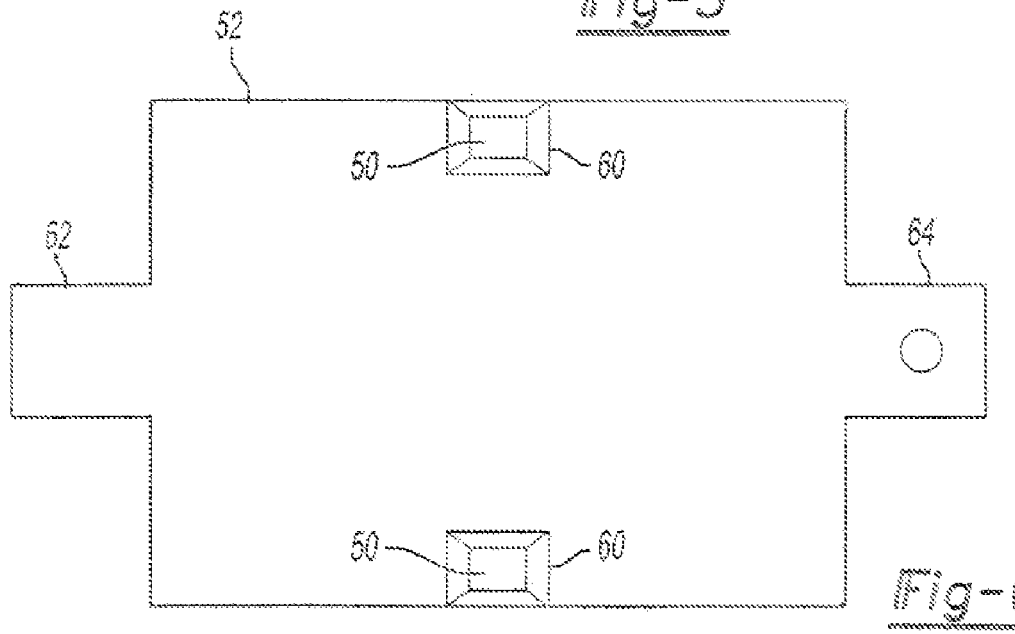
FIG. 6 is a bottom-perspective view of a control module according to the present teachings.

Now referring to FIGS. 4-6, an electronic control module 48 is provided with locating and locking pins 50 formed on a lower surface 52 of casing 54. Pins 50 correspond to a pair of apertures or recesses 56 formed in mounting plate 58. Although pins 50 shown in FIG. 4-6 are pyramidal in shape, it should be understood that pins 50 may have a shape similar to pins 20 shown in FIGS. 1-3, or any other shape desired, without departing from the spirit and scope of the present teachings. Furthermore, pins 50, although shown to have a tapered surface 60, do not require tapered surface 80. Tapered surface 60, however, ensures contact between locating and locking pins 50 and aperture 56 to eliminate movement of control module 48 relative to mounting provisions on the car body. For example, pin 50 without tapered surface 80 functions the same way as the design shown in FIGS. 1-6 when engaging with a tapered mounting aperture.

Because pins 50 are formed on lower surface 52 of casing 54, only a single leverage tab 62 and fastening tab 64 are required. Furthermore, leverage tab 62 does not require a pin 20 like that shown in FIGS. 1-3. Regardless, casing 64 may include at least one curved surface 66 that enables casing 54 to act as a lever when control module 48 is installed.

Because casing 54 may act as a lever, a completely flat mounting surface is not required to attach control module 48 to mounting surface 58. Similarly to control module 10 illustrated in FIGS. 1-3, control module 48 may be installed more quickly, because only a single fastening joint is used to secure control module 48 to mounting plate 58. Accordingly, material costs and vehicle weight are reduced, and productivity is increased.

Now referring to FIGS. 7 to 11, a control module 70 may include a casing 72 that may have a pair of leverage tabs 74 and at least one fastening tab 76. Although a pair of leverage tabs 74 are illustrated, only a single leverage tab 74 is needed. Similar to the above configurations, fastening tab 76 may include an aperture 78 for accommodating a fastener 80 that fastens to a mounting surface 82 of the motor vehicle. Fastener 80 may be any type of fastener such as a screw or bolt.

Fastening tab 76 may be integral and generally coplanar with a bottom surface 84 of casing 72. In contrast to fastening tab 76, leverage tabs 74 extend downward from bottom surface 84. Leverage tab 74 may include a pin 86 that, couples to an aperture 88 formed in a mounting surface 82. Pin 86 may be similar to pin 20 illustrated in FIGS. 1-3 and may function in an equivalent manner. Alternatively, leverage tabs 74 may be generally coplanar with bottom surface 84 of casing 72 and fastening tab 76 may extend downward from bottom surface 84.

Leverage tabs 74 extending downward from casing 72 enable module 70 to be mounted to surface 82, which may be uneven or in a position on the vehicle where adaptive mount tabs and/or brackets may not be used. Regardless, the downward extension of leverage tabs 74 relative to bottom surface 84 of casing 72 enables module 70 to act as a lever.

To install control unit 70, an installer manipulates the casing 72 such that leverage tabs 74 are passed through passage 90 formed in mounting surface 82. Pins 86 are subsequently aligned beneath apertures 88 that may also be formed in mounting surface 82. Because leverage tabs 74 extend downward relative to bottom surface 84, casing 72 may be rotated to raise pins 86 to a position that engages apertures 88. After pins 86 engage apertures 88, the installer may use fastener 80 to secure fastening tab 76 to mounting surface 82.

As stated above, casing 72 may act as a lever. Securing fastening tab 76 to mounting surface 82 with fastener 80 forces and maintains contact between leverage tabs 74 and mounting surface 82. Forces of mounting surface 82 and fastener 80 exerted on leverage tabs 74 and fastening tab 76, respectively, counterbalance the force of mounting surface 82 exerted on bottom surface 84 to reliably secure control module 70 to the motor vehicle. Because of these counterbalancing forces, only a single fastener 80 is needed to ensure that control module 70 remains secured to the motor vehicle. Because only a single fastener 80 is required, the time required to install control module 70 may be reduced. Reducing installment time increases productivity. Moreover, a reduced quantity of fasteners results in lower material costs and vehicle weight.

Control modules 10, 48 and 70 may be monolithic structures having leverage tabs 16, 62, and 74 and fastening tabs 18, 64, and 74 integral therewith, respectively. Alternatively, leverage tabs 16, 62, and 74 and fastening tabs 18, 64, and 74 may be welded to casings 12, 54, and 72. Another alternative includes omitting fastening tabs 18, 64, and 74 in favor of apertures or countersinks formed in casings 12, 54, and 72, and/or omitting leverage tabs 16, 62, and 74 in favor of pins 20, 72 formed in casing 12 and 72 similar to pin 50 being formed in casing 54. In this regard, so long as modules 10, 48, and 70 may be securely fastened to a mounting surface, apertures or countersinks may be formed in any portion of modules 10, 48, and 70 and a portion of the casing main body serving as leverage point without departing from the spirit and scope of the present teachings.

Casings 12, 54, and 72 may be cast or molded from a metal or plastic material. For example, metals that may be used to form casings 12, 54, and 72 include aluminum and steel. Plastic materials include thermoplastics that may be injection or compression molded. Regardless, materials for casings 12, 54, and 72 should be rigid and able to withstand various vibrations experienced during operation of a motor vehicle, as well as able to withstand temperatures, humidity, salt, and other climatic, environmental, and chemical impacts associated with operating electronics and non-electronic devices used in a motor vehicle.

The description of the present teachings is merely exemplary in nature and, thus, variations that do not depart from the gist of the present teachings are intended to be within the scope of the present teachings. Such variations are not to be regarded as a departure from the spirit and scope of the present teachings.

What is claimed is:

1. A module comprising:
    a casing;
    a leverage tab attached to a first end of said casing; and
    a fastening tab attached to a second end of said casing,
    wherein said leverage tab and said fastening tab receive forces exerted thereon from a first direction that counterbalance a force exerted on said casing from second direction, said first direction being opposite said second direction.

2. The module of claim 1, wherein said leverage tab includes a pin.

3. The module of claim 2, wherein said pin includes a tapered surface.

4. The module of claim 1, wherein said fastening tab includes an aperture for a fastener.

5. The module of claim 1, wherein said casing includes a pivot point that enables said casing to act as a lever.

6. The module of claim 1, further comprising at least one locating and locking pin.

7. The module of claim 1, further comprising a plurality of leverage tabs.

8. The module of claim 1, wherein one of said leverage tab and said fastener tab extends downward relative a lower surface of said casing.

9. A control module for mounting to a mounting surface, comprising;
    a casing;
    a locating and locking pin integral with said casing;
    a leverage tab extending from a first end of said casing; and
    a fastening tab extending from a second end of said casing,
    wherein said leverage tab and said fastening tab receive forces from a first direction that counterbalances a force exerted on said casing by the mounting surface in a second direction that is opposite said first direction.

10. The control module of claim 9, wherein said leverage tab includes a pin.

11. The control module of claim 9, wherein said casing includes a plurality of locating and locking pins.

12. The control module of claims 11, wherein said locating and locking pin is pyramidal-shaped.

13. The module of claim 9, wherein said fastening tab includes an aperture for a fastener.

14. The control module of claim 9, wherein said casing includes a curved lower surface providing a pivot point.

15. A control module for mounting to a surface and a vehicle mount, comprising:
    a casing;
    at least one leverage tab integral with said casing that contacts the vehicle mount; and
    a fastener securing said casing to the surface,
    wherein said leverage tab is subjected to a force from a first direction by the vehicle mount that is counterbalanced by a force exerted on said casing from a second and opposite direction by the surface.

16. The control module of claim 15, wherein said leverage tab includes a pin that engages an aperture formed in the surface.

17. The control module of claim 15, wherein said pin includes a tapered surface.

18. The control module of claim 15, wherein said casing includes a plurality of locating and locking pins, 19. The control module of claim 15, wherein said leverage tab extends downward relative to said casing.

20. The control module of claim 15, further comprising a fastening tab integral with said casing for said fastener.

* * * * *